United States Patent [19]

Johansson et al.

[11] Patent Number: 5,309,086
[45] Date of Patent: May 3, 1994

[54] CURRENT MEASURING TRANSDUCER OPERATING ON THE COMPENSATION PRINCIPLE

[75] Inventors: Kai Johansson, Västerskog; Matti Lounila, Espoo; Juha Kokkonen, Vantaa, all of Finland

[73] Assignee: ABB Stromberg Drives OY, Helsinki, Finland

[21] Appl. No.: 36,688

[22] Filed: Mar. 25, 1993

[30] Foreign Application Priority Data

Apr. 2, 1992 [FI] Finland ............................ 921460

[51] Int. Cl.$^5$ ............................................ G01R 33/00
[52] U.S. Cl. ................................ 324/117 R; 324/127; 324/158 R
[58] Field of Search ............... 324/117 R, 127, 130, 324/158 R, 725; 340/664; 323/357

[56] References Cited

U.S. PATENT DOCUMENTS

| | | | |
|---|---|---|---|
| 4,118,597 | 10/1978 | Proctor et al. | 324/117 R |
| 4,482,862 | 11/1984 | Leehey | 324/117 R |
| 4,616,174 | 10/1986 | Jorgensen | 324/117 R |
| 4,899,103 | 2/1990 | Katzenstein | 324/117 R |
| 4,912,396 | 3/1990 | Groenenboom | 324/117 R |
| 4,967,145 | 10/1990 | Davies | 324/127 |
| 5,008,612 | 4/1991 | Otto | 324/117 R |

FOREIGN PATENT DOCUMENTS 0335511  4/1989  European Pat. Off. .
2244142A 11/1991 United Kingdom .

*Primary Examiner*—Kenneth A. Wieder
*Assistant Examiner*—Christopher M. Tobin
*Attorney, Agent, or Firm*—Watson, Cole, Grindle & Watson

[57] ABSTRACT

The invention relates to a current measuring transducer operating on the compensation principle, comprising two magnetic cores (C1, C2) with windows; windings wound thereon for both a current (Ip) to be measured and for a compensation current (Is); and means (Um, Nm, R1, D, IA) for generating the compensation current and adjusting the magnitude thereof. To compensate for induced interference voltages, a further winding (Nc1, Nc2) is arranged about both magnetic cores of the current transducer. To widen the frequency band, the windings (Nc1, Nc2) are series-connected in a closed loop through a frequency-dependent impedance (Z).

1 Claim, 1 Drawing Sheet

CURRENT MEASURING TRANSDUCER OPERATING ON THE COMPENSATION PRINCIPLE

This invention relates to a current measuring transducer operating on the compensation principle comprising a first magnetic core with a window, a first winding for a current to be measured and a second winding for a compensation current being wound on said magnetic core;

a second magnetic core with a window, the first winding and the second winding being also wound about said second magnetic core;

means for generating the compensation current and adjusting the magnitude thereof so that a magnetic flux generated in the first magnetic core by the compensation current compensates for a magnetic flux generated in the first magnetic core by the current to be measured, said means for generating and adjusting the compensation current comprising a third winding arranged to magnetize the first core by a magnetizing current;

a fourth winding wound on the first magnetic core; and a fifth winding wound on the second magnetic core, the fourth and the fifth winding having an equal number of turns and being series-connected in a closed loop through an impedance the value of which at the frequency of the magnetizing current is so low that the magnetic flux caused by the fifth winding in the second magnetic core is at least substantially equal but opposite in direction to the magnetic flux acting in the first magnetic core.

Current transducers for measuring direct and alternating current often employ the compensation principle, i.e. the flux caused in the magnetic core by the current flowing in the primary winding is compensated for by a current supplied to the secondary winding. To control the secondary current, a sensor or the like detector is placed in the magnetic circuit to monitor the zero point of the flux of the core. A zero flux prevails in the core when the current supplied to the secondary winding compensates for the flux caused by the current of the primary winding. At higher frequencies, the current transducer is able to operate as a passive current transformer so that the current flowing in the secondary winding is directly proportional to the current to be measured in the primary winding within a wide frequency range.

A current measuring transducer of the type described in the introductory chapter is known e.g. from U.S. Pat. No. 4,482,862. The detector used in the transducer is a magnetic core having a window and being magnetizable by a high frequency. The zero flux is detected by observing the waveform of the magnetizing current of the core. However, the magnetic flux caused in the core by the high-frequency magnetizing current tends to induce interference voltages both in the winding intended for the current to be measured and in the winding intended for the compensation current. To compensate for such interference voltages, the current transducer comprises a second magnetic core with a window, and a winding is provided on both the second and the first magnetic core, which windings have an equal number of turns and are series-connected with each other in a closed loop. The winding intended for the current to be measured and the winding intended for the compensation current are also arranged about the second magnetic core. As a consequence, the magnetic flux caused in the second magnetic core by the winding wound about the second core is equal but opposite in direction to the magnetic flux acting in the first magnetic core, and so the magnetizing current will not cause any interference voltages. However, at higher frequencies, the current flowing in the windings connected in a closed loop increases with the frequency of the current to be measured, and so the magnetic circuit formed by the first and the second magnetic core and the windings wound thereon for the current to be measured and for the compensation current is not able to operate as a passive current transformer. In order that the current transducer would be operative even at high frequencies, it further comprises a third magnetic core with a window. The third magnetic core generates a medium-frequency error signal to be added to an error signal representing low frequencies. In this way the compensation current will be adjusted to an appropriate level even in cases where the current to be measured comprises medium-frequency components.

The object of the present invention is to provide a current measuring transducer operating on the compensation principle and eliminating the problems associated with the above-described arrangement. The current transducer to be provided has a high accuracy and a wide bandwidth in spite of being simple in structure.

The above-mentioned object is achieved by means of a current measuring transducer according to the invention which is characterized in that the impedance included in the loop formed by the fourth and the fifth winding is frequency-dependent and has such a high value at the frequency of the AC component of the current to be measured that it prevents the flow of an excessive current of said frequency through the fourth and the fifth winding. Accordingly, the current flowing through the fourth and the fifth winding is not allowed to increase to such a high level that the power derived by it from the magnetic circuit formed by the first and the second magnetic core and the windings for the current to be measured and for the compensation current would prevent the magnetic circuit from operating as a passive current transformer. The current transducer according to the invention thus has a wide bandwidth though it does not comprise the third magnetic core and associated circuit according to U.S. Pat. No. 4,482,862.

In the following the current measuring transducer according to the invention will be described in more detail by means of an illustrating structural arrangement with reference to the attached drawings, in which.

Figure 1:
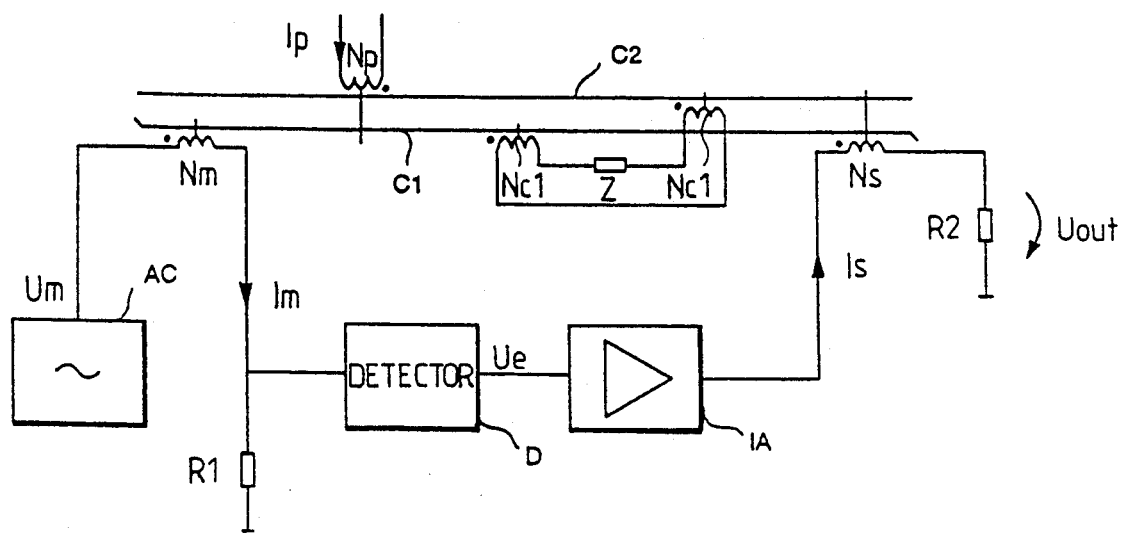
FIG. 1 is a schematic circuit diagram of a current measuring, transducer.

The current transducer shown in FIG. 1 comprises two magnetic cores C1 and C2; five windings wound thereon for different purposes; and associated electronics, as will be described more closely below. The magnetic core C1 is saturable while the core C2 operates within its linear range.

Figure 2:
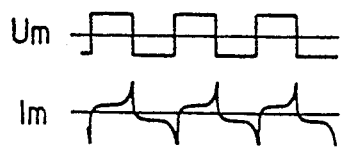
FIG. 2 illustrates the waveform of a voltage Um to be applied to a magnetizing winding and a magnetizing current Im induced in the magnetizing winding by the voltage.

The magnetic core C1 is magnetized up to saturation by applying an AC voltage Um from an alternating voltage source AC to a magnetizing winding Nm wound on the core C1, the time integrals of the positive and the negative half-cycle of the AC voltage Um being equal. If the voltage Um has a rectangular waveform, the waveform of the voltage and that of the magnetizing current Im produced by it in the magnetizing winding Nm are such as shown in FIG. 2. The magnetizing current Im is measured by a resistor R1 having its one pole connected to ground potential, the voltage developed across the resistor R1 being applied to a detector D. The output voltage Ue of the detector D is proportional to the asymmetry of the peak values of the voltage developed across the resistor R1. The voltage Ue in turn controls an integrating variable gain amplifier IA which applies a current Is to a compensation winding Ns wound on both two magnetic cores C1 and C2. A current Ip to be measured flows in a winding Np wound on both magnetic cores C1 and C2.

When the ampere-turns NpIp and NsIs magnetizing the magnetic core C1 (where Np and Ns also correspond to the number of turns of the windings) are equal, a voltage $U_{out}$ acting across a resistor R2, through which the compensation current Is flows, can be expressed by the equation $$U_{out} = R2 \; Ip \; Np/Ns$$

Ip is easy to solve from the equation.

If the ampere-turns NpIp and NsIs are unequal, the magnetization of the magnetic core C1 deviates from zero at the frequency of the current Ip to be measured, and so a residual magnetic flux flows in the magnetic core C1 and deforms the waveform of the magnetizing current Im so that it becomes asymmetric. As the detector D is arranged to monitor the asymmetry of the peak values of the voltage developed across the resistor R1 by the current Im, the output Ue of the detector D gets a value proportional to both the degree and direction of the asymmetry in an asymmetry situation. The value Ue thus also indicates which one of the ampere-turns NpIp and NsIs is greater. By means of this control input Ue, the integrating variable gain amplifier IA is now able to change the current Is so that the magnetizing current Im will again be symmetrical.

The magnetic flux generated in the magnetic core C1 by the high-frequency magnetizing current Im tends to induce an interference voltage in the windings Np and Ns. To compensate for the interference voltage, windings Nc1 and Nc2 are arranged about the magnetic cores C1 and C2. The winding Nc1 is wound on the magnetic core C1, and the winding Nc2 is wound on the magnetic core C2. The windings Nc1 and Nc2 have an equal number of turns. As the magnetic core C2 is dimensioned to operate within its linear range, it does not substantially affect the magnetization of the magnetic core C1. The windings Nc1 and Nc2 are interconnected at their opposite poles through an impedance Z while their other opposite poles are interconnected directly. Accordingly, the windings Nc1 and Nc2 can be said to be series-connected in a closed loop including the impedance Z. The impedance Z is realized so that its value at the frequency of the magnetizing current Im is so low that the magnetic flux generated by the winding Nc2 in the magnetic core C2 is substantially equal but opposite in direction to the magnetic flux generated by the magnetizing current Im in the magnetic core C1 through the winding Nm. The total flux penetrating the windings Np and Ns is thereby close to zero, and the occurrence of excessive interference voltages is prevented.

The AC component of the current Ip to be measured in the winding Np, however, also tends to induce a current in the windings Nc1 and Nc2. If the flow of the current is not restricted, the magnetic circuit formed by the cores C1 and C2 and the windings Np and Ns cannot operate as a passive current transformer at higher frequencies, so that the upper threshold frequency of the current transducer remains low. This upper threshold frequency can, however, be increased in such a way that the impedance Z, which is series-connected with the windings Nc1 and Nc2, is given, at the frequency of the AC component of the current Ip to be measured, a value sufficiently high to prevent the flow of an excessive current of the same frequency as that of the AC component in the windings Nc1 and Nc2. In practice, the simplest way to realize a desired frequency-dependent impedance Z is to employ a capacitor of appropriate size.

The current measuring transducer according to the invention has been described above by means of a single illustrating embodiment, and it is to be understood that many of the structural components can be realized by one skilled in the art in a way different from that described in the above example without, however, deviating from the scope of protection of the invention defined in that attached claim. Accordingly, particularly the means for adjusting the magnitude of the compensation current, that is, the voltage source Um, the detector D and the variable gain amplifier IA may differ from those described above.

We claim:
1. Current measuring transducer operating on the compensation principle, comprising
    a first magnetic core with a window, a first winding for a current to be measured and a second winding for a compensation current being wound on said magnetic core;
    second magnetic core with a window, the first winding and the second winding being also wound about said second magnetic core;
    means for generating the compensation current and adjusting the magnitude thereof so that a magnetic flux generated in the first magnetic core by the compensation current compensates for a magnetic flux generated in the first magnetic core by the current to be measured, said means for generating and adjusting the compensation current comprising a third winding arranged to magnetize the first core by a magnetizing current;
    a fourth winding wound on the first magnetic core; and
    a fifth winding wound on the second magnetic core, the fourth and the fifth winding having an equal number of turns and being series-connected in a closed loop through an impedance the value of which at the frequency of the magnetizing current is so low that the magnetic flux caused by the fifth winding in the second magnetic core is at least substantially equal but opposite in direction to the magnetic flux acting in the first magnetic core, said impedance being frequency-dependent and having such a high value at the frequency of the AC component of the current to be measured that it prevents the flow of an excessive current of said frequency through the fourth and the fifth winding.

* * * * *